United States Patent [19]

Teratani et al.

[11] Patent Number: 4,547,731
[45] Date of Patent: Oct. 15, 1985

[54] HIGH FREQUENCY CURRENT INDUCING APPARATUS

[75] Inventors: Tatsuo Teratani, Toyota; Masao Kodera, Okazaki, both of Japan

[73] Assignees: Toyota Jidosha Kabushiki Kaisha, Toyota; Nippon Soken, Inc., Nishio, both of Japan

[21] Appl. No.: 474,323

[22] Filed: Mar. 11, 1983

[30] Foreign Application Priority Data

Mar. 24, 1982 [JP] Japan ............................ 57-46962
May 14, 1982 [JP] Japan ............................ 57-71026

[51] Int. Cl.$^4$ ............................................ G01R 27/04
[52] U.S. Cl. .................................. 324/58 R; 324/158 R
[58] Field of Search .......... 324/58 R, 95, 102, 150 R; 333/12, 115

[56] References Cited

U.S. PATENT DOCUMENTS 2,606,974  8/1952  Wheeler ........................ 333/115
4,011,529  3/1977  Garcia ........................... 324/58 R
4,278,933  7/1981  Klopach et al. ................ 324/58 R Primary Examiner—Stewart J. Levy
Assistant Examiner—Stephen M. Baker
Attorney, Agent, or Firm—Cushman, Darby & Cushman

[57] ABSTRACT

A high frequency current inducing apparatus for inducing high frequency current in a wiring harness of an instrument to be examined without the necessity of detaching the wiring harness from the instrument. A high frequency current inducing chamber is connected to a high frequency oscillator for inducing the high frequency current in the wiring harness of the instrument to be inspected, and a terminator is connected to the high frequency inducing chamber. The chamber includes an outer conductor and an inner conductor fixed at a predetermined position inside the outer conductor. The outer conductor has two inserting holes for insertion of the wiring harness along the axis of the chamber between the two conductors. The outer conductor can be separated along a plane including the two inserting holes. Once separated, the wiring harness of the instrument to be inspected can be inserted along the axis of the chamber without detaching the wiring harness from the instrument.

15 Claims, 16 Drawing Figures

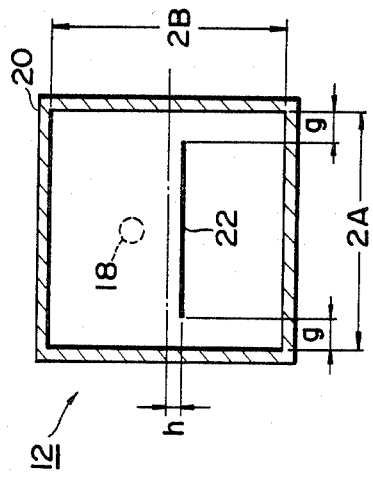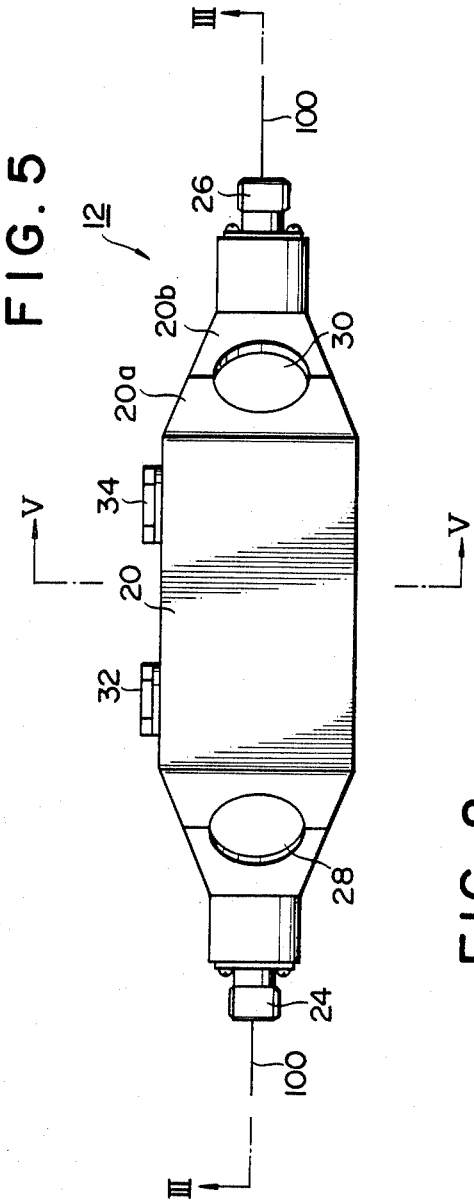

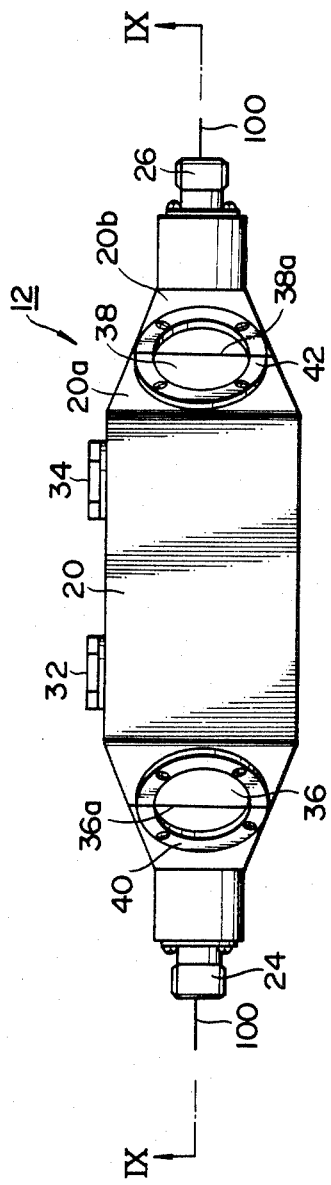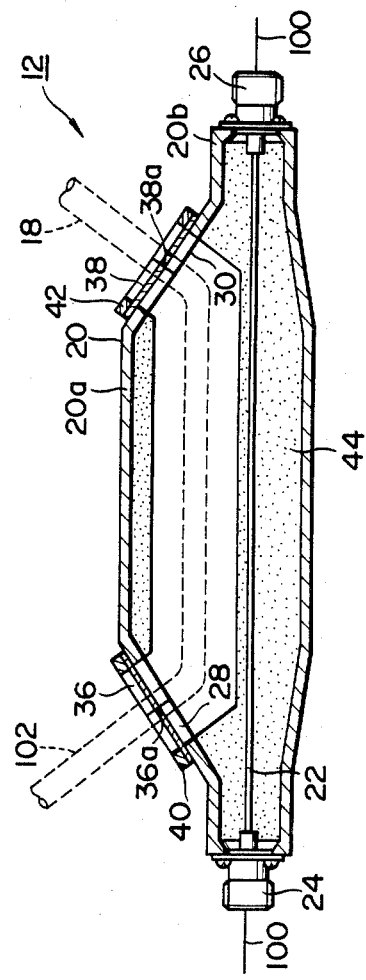
FIG. 8
FIG. 9

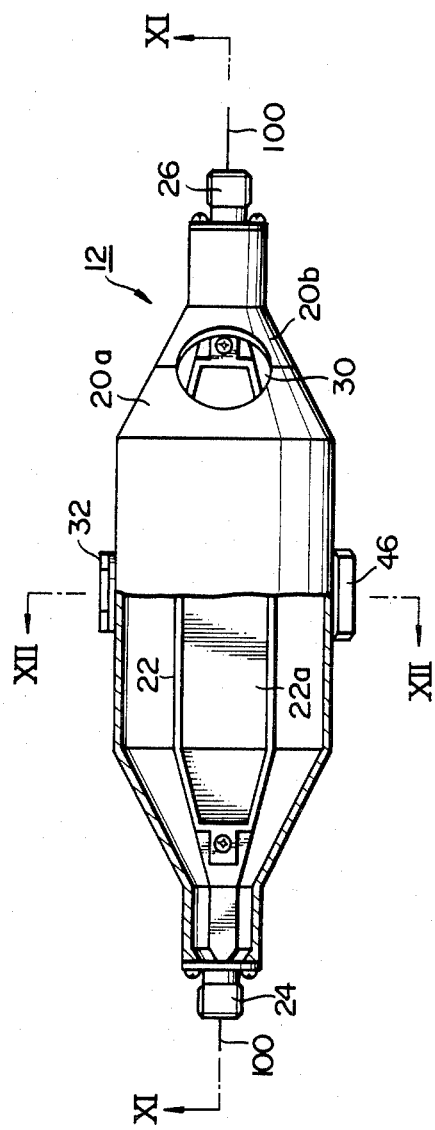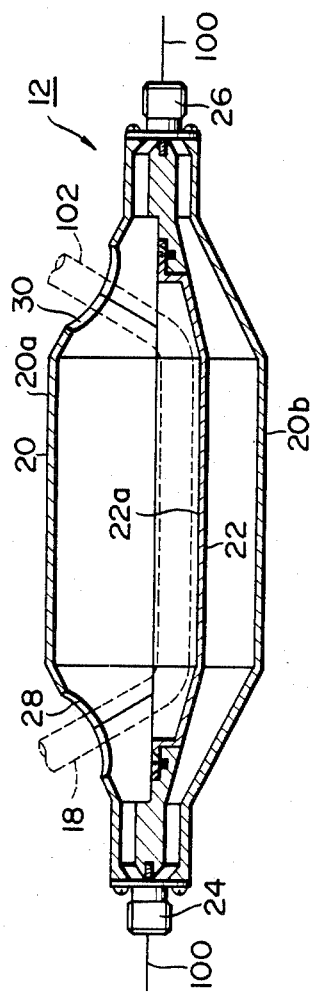

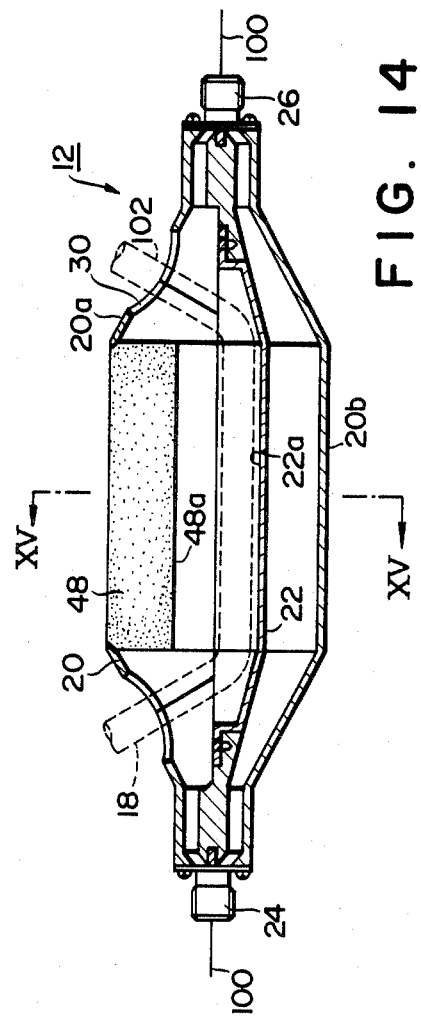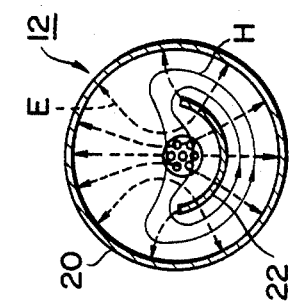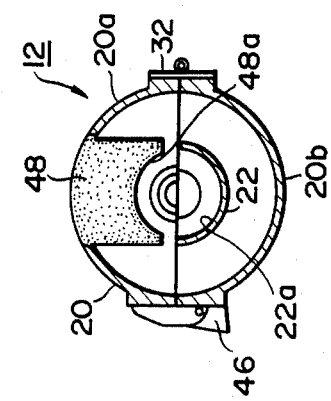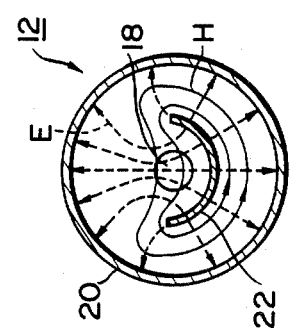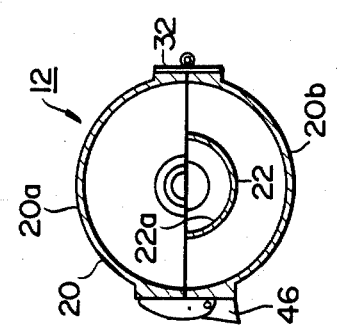

HIGH FREQUENCY CURRENT INDUCING APPARATUS

BACKGROUND OF THE INVENTION

1. Field of the Invention

This invention relates to a high frequency current inducing means, and more particularly to a high frequency current inducing means which induces high frequency current through a wiring harness to an instrument to be examined.

2. Description of the Prior Art

The electro-magnetic compatibility (EMC) of an electronic instrument with high frequency current has been widely studied and a high frequency current inducing means is conventionally required to induce the high frequency current to a wiring harness of an electronic instrument to be examined.

A high frequency current inducing means of the prior art includes a means that directly induces the high frequency current to the wiring harness by way of a capacitor. In the prior art means mentioned above, the examining operation becomes complicated especially if the wire is used in plurality since the wiring harness must be disconnected from the electronic instrument, and thus the high frequency current inducing means must be larger in size. Furthermore, there are other drawbacks in that the electric characteristics of the wires are affected since the capacitor must be in direct contact with the wires.

In the high frequency current inducing means of the other prior art devices a core type high frequency current probe is well known as well as a TEM cell of a large electro-magnetic shielded box in which the total body of the instrument to be examined is subjected to a high frequency electromagnetic field. The core type high frequency current inducing means in the prior art, however, is limited in its applicable frequency band by the high frequency characteristics of the core, and cannot perform efficient high frequency inducing action. Furthermore, as the TEM cell requires large scale facilities since the electronic instrument to be examined must be contained in the shielded box, the electronic instrument cannot be externally operated and cannot be simply examined by the high frequency current induction.

SUMMARY OF THE INVENTION

Accordingly, it is an object of the present invention to provide a high frequency current inducing means which is relatively small sized and able to induce high frequency current to a wiring harness of an instrument to be examined with efficiency and simplicity, and which has wide frequency-band capability.

In keeping with the principle of the present invention, the object of the present invention is accomplished with a high frequency current inducing means which includes a high frequency oscillator, a high frequency current inducing chamber being connected to the high frequency oscillator and inducing the high frequency current to a wiring harness of the instrument to be inspected and a terminator being connected to the high frequency current inducing chamber. The high frequency current inducing chamber may comprise an outer conductor and an inner conductor (fixed at a predetermined portion in the inside of the outer conductor). This arrangement has at least two inserting holes in order for a wiring harness to be there inserted along the axis of the chamber between the outer conductor and the inner conductor, and the outer conductor is formed so that it can be separated along the surface including the two inserting holes into two outer conductor portions. High frequency current can be induced through the wiring harness to the instrument to be inspected by means of inserting the wiring harness along the axis of the chamber without detaching the wiring harness from the instrument to be inspected.

BRIEF DESCRIPTION OF THE DRAWINGS

FIG. 1 shows an exemplary block diagram showing an examining circuit by representative high frequency current inducing means in accordance with the teachings of the present invention;

FIG. 2 is an illustration of an exemplary high frequency current inducing chamber in a first embodiment in accordance with the teachings of the present invention;

FIG. 5 is a sectional view taken along line V—V of FIG. 2;

FIG. 8 is an illustration describing a high frequency current inducing chamber for an exemplary second embodiment in accordance with the teachings of the present invention;

FIG. 9 is a sectional view taken along line IX—IX of FIG. 8;

FIG. 10 is an illustration describing a high frequency current inducing chamber for an exemplary third embodiment in accordance with the teachings of the present invention;

FIG. 11 is a sectional view taken along line XI—XI of FIG. 10;

FIG. 12 is a sectional view taken along line XII—XII of FIG. 10;

FIG. 13 is an illustration showing distributions of a high frequency electric field and a high frequency magnetic field in high frequency current induction;

FIG. 14 is an illustration describing a high frequency current inducing chamber for an exemplary fourth embodiment in accordance with the teachings of the present invention;

FIG. 15 is a sectional view taken along line XV—XV of FIG. 14; and

FIG. 16 is an illustration showing distributions of a high frequency electric field and a high frequency magnetic field when the high frequency current is induced to each of the wires in the wiring harness.

DETAILED DESCRIPTION OF THE EMBODIMENTS

Figure 3:
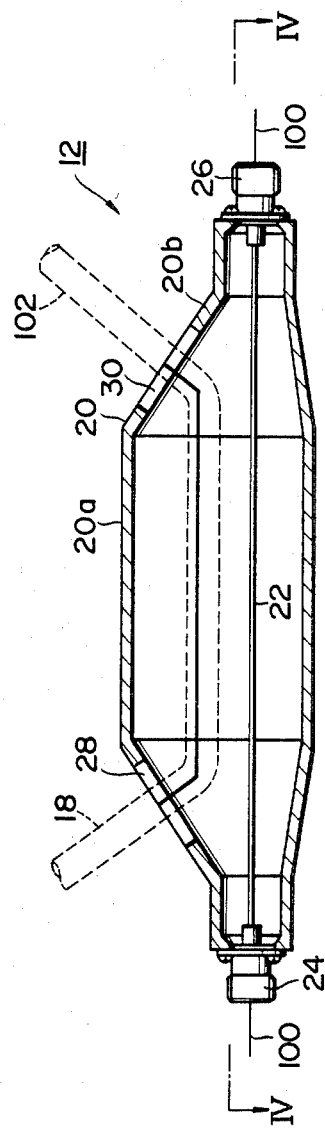
FIG. 3 is a sectional view taken along line III—III of FIG. 2.

Referring more particularly to the drawings, FIG. 1 shows a block diagram showing an examining circuit by a high frequency current inducing means in accordance with the teachings of the present invention. In FIG. 1, a high frequency current inducing chamber 12 of the present invention is connected to a high frequency oscillator 10 and a terminator 14 is attached to the high frequency current inducing chamber 12.

In this present invention a wiring harness 18 of an instrument 16 to be inspected is inserted through the high frequency current inducing chamber 12 so that high frequency current can be induced to the instrument 16 to be examined through the wiring harness. The impedance of the high frequency current inducing chamber 12 is equal to the output impedance of the high frequency oscillator 10, and the impedance of the terminator 14 is set equal to the output impedance of the high frequency oscillator 10 and the impedance of the high frequency current inducing chamber 12. Furthermore, it is preferable to set the impedance of cables electrically connecting the high frequency current inducing chamber 12 to the high frequency oscillator 10 and the high frequency current inducing chamber 12 to the terminator 14 equal to the impedance characteristics of the high frequency current inducing chamber 12. Accordingly, the high frequency signal 100 from the high frequency oscillator 10 is efficiently transmitted without reflection by the high frequency current inducing chamber 12 and the terminator 14.

Figure 4:
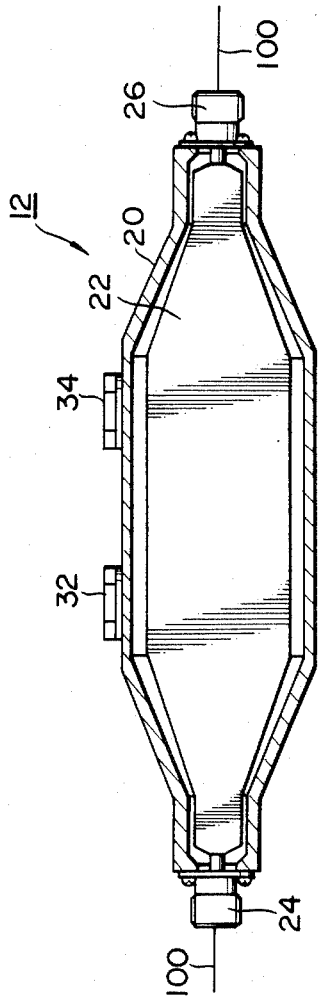
FIG. 4 is a sectional view taken along line IV—IV of FIG. 3.

FIG. 2 shows the high frequency current inducing chamber 12 in accordance with the first embodiment of the present invention, and FIGS. 3, 4 and 5 are its sectional view.

In FIGS. 2, 3, 4 and 5, the high frequency current inducing chamber 12 comprises an outer conductor 20 which is shaped like a pipe with a rectangular section and an inner conductor 22 which is shaped like a plate and is fixed to a predetermined position within the outer conductor. The outer conductor 20 is tapered at both ends where the connectors 24 and 26 are present. The inner conductor 22 is held by the connectors 24 and 26 so as to be insulated from the outer conductor 20.

In FIGS. 2 and 3, the high frequency current inducing chamber 12 has circular inserting holes 28 and 30 through which the wiring harness 18 is inserted between the outer conductor 20 and the inner conductor 22. So inserted, the wiring harness 18 is aligned along the chamber axis. The outer conductor 20 can be separated along the surface including the above mentioned inserting holes 28 and 30 into two outer conductor portions 20a and 20b so that the wiring harness can be inserted to the inside of the outer conductor 20 without detaching the wiring harness 18 from the instrument 16 to be examined, with the outer conductor portion 20a formed to swing away from the outer conductor portion 20b by hinges 32 and 34. Accordingly, the inserting holes 28 and 30 can be separated into semicircular portions state, which enables the wiring harness 18 to be inserted to the inside of the outer conductor 20 without detaching the wiring harness 18 from the instrument 16 to be examined.

The high frequency current inducing chamber 12 in accordance with the teachings of the present invention is formed so the most suitable electromagnetic value for the wiring harness 18 inserted into its inside can be efficiently supplied with high frequency current. Especially, in order to efficiently induce the high frequency current to the wiring harness 18 which is arranged along the axis of the chamber, the internal composition of the chamber is selected so that the impedance characteristics determined by its composition can be constant at any position along the axial length of the chamber.

In other words, as well known, the impedance characteristics of a conductive chamber of this kind are determined by the ratio of the respective parameters A, B, g and h shown in FIG. 5. As the high frequency current inducing chamber 12 of this embodiment is constantly for the ratio of the parameters A, B, g and h along the axis of the chamber at any given place, the interior impedance characteristics of the high frequency current inducing chamber 12 become a constant value in spite of the axial direction of the chamber, and the wiring harness 18 to be arranged along the axial length of the chamber can be efficiently induced with the high frequency current.

The first preferred embodiment of the present invention is composed as described heretofore and its operation will be hereinafter described.

At first, the outer conductor portion 20a is rotated at the hinges 32 and 34 to separate from the outer conductor portion 20b so that the inserting holes 28 and 30 can be opened and the wiring harness 18 of the instrument to be inspected can be easily inserted along the axis direction of the chamber between the outer conductor 20 and the inner conductor 22. Secondly, the outer conductor 20a is returned to the position where it joins to the other outer conductor portion 20b. Therefore, the wiring harness 18 can be positioned right between the outer conductor 20 and the inner conductor 22 without detaching the wiring harness 18 from the instrument 16 to be examined. According to this embodiment, the wiring harness 18 can be completely inserted into the high frequency current inducing chamber 12 with the least electromagnetic leak to the outside.

After the wiring harness 18 is inserted properly in the high frequency current inducing chamber 12, the high frequency signal 100 is supplied from the high frequency oscillator 10 to the high frequency current inducing chamber 12. A high frequency signal 102 is induced in the wiring harness 18 through the electromagnetic field made by the high frequency signal 100 in the high frequency current inducing chamber 12.

Figure 6:
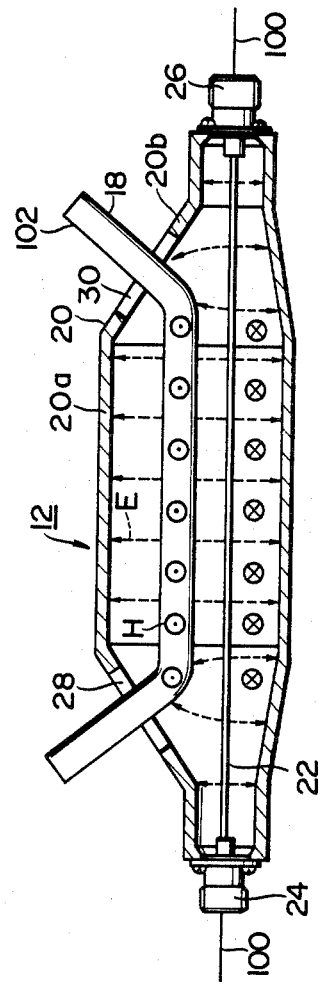
FIGS. 6 and 7 are illustrations showing distributions of a high frequency electric field and a high frequency magnetic field in high frequency current induction.
Figure 7:
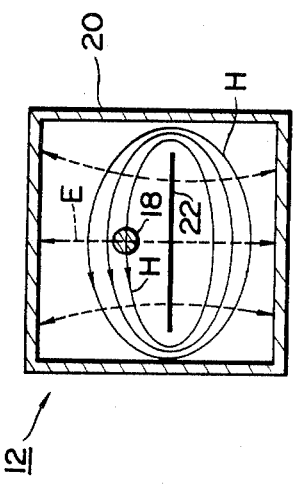

FIGS. 6 and 7 show the distribution of the electromagnetic field in the induction of the high frequency current. When the high frequency signal 100 flows through the inner conductor 22, the high frequency electric field E and the high frequency magnetic field H are produced in the high frequency current inducing chamber 12. Since the high frequency electric field E and the high frequency magnetic field H penetrate through the wiring harness 18 at this time, the high frequency signal 102 arises in the wiring harness 18.

As mentioned above, according to the first embodiment of the present invention, the impedance characteristics of the high frequency current inducing chamber 12 are constant along its axis direction, and the instrument 16 to be inspected is supplied the high frequency signal by way of the wiring harness 18. The wiring harness is not required to be detached from the instrument to be examined at this time, and the externally located instrument 16 to be examined can be easily operated during its examination.

FIG. 8 shows the high frequency current inducing chamber 12 of the second embodiment in accordance with the teachings of the present invention, and FIG. 9 shows its sectional view.

As shown in FIGS. 8 and 9, circular films 36 and 38 consisting of conductive rubber are respectively fixed to the inserting holes 28 and 30 by circular metal rings 40 and 42, and have cuts 36a and 38a in their center portions to pass the wiring harness 18. The films 36 and 38, therefore, can prevent the high frequency electric field E and the high frequency magnetic field H from leaking through the inserting holes 28 and 30.

On the other hand, since the space complimentary to the inserting passage of the wiring harness 18 in the high frequency current inducing chamber 12 is filled with a foam material 44, the inner conductor 22 is not only firmly fixed but also the wire harness 18 is firmly inserted and supported in the high frequency current inducing chamber 12 without any adverse effect on the impedance characteristics of the high frequency current inducing chamber 12.

According to the second embodiment in FIGS. 8 and 9, the instrument 16 to be examined can be efficiently supplied the high frequency signal 102 by way of the wiring harness 18 without detaching the wiring harness 18 from the instrument 16 to be examined.

In the first and second embodiments described above, as shown in the respective Figures, when the wiring harness 18 can be inserted in the right angle direction to each of the high frequency electric field E and the high frequency magnetic field H produced in the high frequency current inducing chamber 12, high frequency current is efficiently produced in the wiring harness 18.

FIG. 10 shows the high frequency current inducing chamber 12 for an exemplary third embodiment in accordance with the teachings of the present invention, and FIGS. 11 and 12 show its sectional views.

In FIGS. 10, 11 and 12, the high frequency current inducing chamber 12 consists of the outer conductor 20 having a tube shape with circular section and the inner conductor 22 of plate type fixed to a predetermined position in the inside of the outer conductor.

In the third embodiment, furthermore, the inner conductor 22 has a curved surface 22a semicircularly curved along the radius of the wiring harness 18, and the wiring harness 18 can be inserted closely to the inner conductor 22. The instrument 16 to be inspected, therefore, can be efficiently supplied high frequency current by way of the wiring harness 18.

In FIGS. 10 and 11, the high frequency current inducing chamber 12 has circular inserting holes 28 and 30 through which the wiring harness 18 can be inserted between the outer conductor 20 and the inner conductor 22. At this time the wiring harness 18 is aligned along the axis of the chamber and the curved surface 22a of the inner conductor 22. The outer conductor 20 can be separated along the surface including the inserting holes 28 and 30 mentioned above into the outer conductor portions 20a with 20b, and the outer conductor portion 20a is adapted to be rotated away from the outer conductor portion 20b by the hinge 32. Furthermore, the outer conductor 20 has a holding lock 46 which holds the outer conductor portion 20a and the outer conductor portion 20b tightly together so that electromagnetic leakage can be prevented.

The third embodiment of the present invention is composed as mentioned hereinabove and its operation will be hereinafter described.

First of all, the holding lock 46 is unlocked. The outer conductor portion 20a is rotated by the hinge 32 to be separated from the other outer conductor portion 20b, and the inserting holes 28 and 30 are opened to form semicircular portions. Secondly, the wiring harness 18 of the instrument 16 to be examined is inserted between the outer conductor 20 and the inner conductor 22 along the axis of the chamber and the curved surface 22a. In the next stage, the outer conductor portion 20a is again rotated and closed to meet the other outer conductor portion 20b. The outer conductor portion 20a and the other outer conductor portion 20b are held together by the holding lock 46. Subsequently, the high frequency signal 100 is supplied from the high frequency oscillator 10 to the high frequency current inducing chamber 12, and the high frequency signal 102 is induced through the wiring harness 18 by the electromagnetic field formed by the high frequency signal 100 in the high frequency current inducing chamber 12.

In other words, as illustrated in FIG. 13 showing the distribution of the electromagnetic field in the induction of the high frequency current, the flow of the high frequency signal 100 through the inner conductor 22 produces the high frequency electric field E and the high frequency magnetic field H in the high frequency current inducing chamber 12, and the high frequency signal 102 is induced in the wiring harness 18 since the high frequency electric field E and the high frequency magnetic field H mentioned above penetrate through the wiring harness 18, as shown. Since the inner conductor 22 has curved surface 22a semicircularly curved against the radius of the wiring harness 18, high frequency current can be induced with high efficiency.

As mentioned above, according to the third embodiment of the present invention, the high frequency signal 102 is efficiently induced for the instrument 16 to be inspected through the wiring harness 18. The wiring harness is not needed to be detached from the instrument 16 to be inspected, and also the instrument 16 to be inspected can be easily operated since it remains outside of the chamber.

FIG. 14 shows the high frequency current inducing chamber 12 for an exemplary fourth embodiment in accordance with the teachings of the present invention, and FIG. 15 shows its sectional view.

In FIGS. 14 and 15, the inner conductor 22 has a curved surface 22a which is semicircularly curved along the radius of the wiring harness 18. The outer conductor portion 20a has on its ceiling a curved guide 48 consisting of a conductive material. This curved guide 48 has a curved surface 48a which is semicircularly curved along the radius of the wiring harness 18. The curved surface 48a is formed along the same circular surface as the curved surface 22a. Accordingly, since the wiring harness 18 can be closely placed on the inner conductor 22 by the curved surface 22a and also can be closely positioned under the curved guide 48 (the outer conductor portion 20a), the instrument 16 to be supplied with inspected can be efficiently induced high frequency current through the wiring harness 18.

According to the fourth embodiment shown in FIGS. 14 and 15, the high frequency signal 102 can be efficiently induced to the instrument 16 to be examined through the wiring harness 18 without detaching the wiring harness from the instrument 16 to be examined.

In the third and fourth embodiments described in the above, it is preferable to make the curved surface 22a of the inner conductor 22 and the curved surface 48a of the curved guide 48 (the outer conductor portion 20a) be curved at almost equal radius to the radius of the wiring harness 18. Since the wiring harness 18 can be positioned more closely to the inner conductor 22 and the curved guide 48, high frequency current can be induced with high efficiency.

In the above described third and fourth embodiments, the wiring harness 18 can be firmly inserted and fixed by the curved surface 22a of the inner conductor 22 and the curved surface 48a of the curved guide 48.

In the above described third and fourth embodiments, furthermore, as shown in FIG. 16, the high frequency current can be equally induced to each of the wires in the wiring harness 18, and stable inducing action can be thus obtained.

In the above described third and fourth embodiments, furthermore, the wiring harness 18 can be inserted between the outer conductor 20 and the inner conductor 22 at right angle direction to each of the high frequency electric field E and the high frequency magnetic field H which are produced in the high frequency current inducing chamber 12 by the curved surface 22a and the curved surface 48a, and the high frequency current can be efficiently produced for the wiring harness 18.

As mentioned above, according to the present invention, high frequency current can be induced through the wiring harness 18 to the instrument 16 to be inspected without detaching the wiring harness 18, and the inducing efficiency of the high frequency current can be largely increased in comparison with prior art devices.

In the present invention, it is preferable that the outer conductor 20, the inner conductor 22 and the curved guide 48 be made of a material which has low specific resistance, e.g., copper, aluminum, silver or the like.

As described heretofore, according to the high frequency current inducing means in accordance with the teachings of the present invention, high frequency current can be easily induced through the wiring harness to the instrument to be inspected without detaching the wiring harness from the instrument to be inspected. High frequency current, therefore, can be efficiently and simply induced through the wiring harness to the instrument to be inspected, and a high frequency current inducing means with wide frequency band and small size is thereby obtained.

In the prior art device using a core type inducing probe, the inducing electric power is limited by the core characteristics and there is unnecessary large radiation from the inducing section. In the present invention, however, the inducing electric power is not limited while the voltage standing wave ratio (VSWR) is set preferably, and there is little unnecessary radiation from the inducing section.

We claim:

1. A high frequency current inducing apparatus comprising:
    a high frequency oscillator;
    high frequency current inducing chamber means, connected to said high frequency oscillator, for inducing high frequency current in a wiring harness of an apparatus to be inspected, said chamber means comprising outer and inner conductors, said inner conductor being fixedly secured at a predetermined position inside said outer conductor, said outer conductor having two inserting holes and being separable into two outer conductor portions along a plane including said two inserting holes so that said wiring harness of said apparatus may be inserted along the axial direction of said chamber means between said outer and inner conductors without detaching said wiring harness from said apparatus to be inspected; and
    a terminator connected to said high frequency current inducing chamber; wherein
    said oscillator and said chamber means may induce high frequency current in said wiring harness while said harness resides in said chamber means.

2. A high frequency current inducing apparatus according to claim 1, wherein said inserting holes of said chamber means are adapted to orient said wiring harness to be at a right angle direction to each of the electric field and the magnetic field in said chamber means.

3. A high frequency current inducing apparatus according to claim 1, further comprising conductive rubber films disposed about said inserting holes of said outer conductor, said rubber films relatively tightly closing said inserting holes and having slits in their center portions through which the wiring harness may pass.

4. A high frequency current inducing apparatus according to claim 1, further comprising foam material within said chamber means excluding the space necessary for insertion of the wiring harness.

5. A high frequency current inducing apparatus according to claim 1, further comprising at least one hinge means for rotatably attaching one of said outer conductor portions to the other of said outer conductor portions.

6. A high frequency current inducing apparatus according to claim 1, wherein said inner conductor has a curved surface semicircularly curved along the radius of an inserted wiring harness.

7. A high frequency current inducing apparatus according to claim 6, wherein said curved surface of said inner conductor is curved with a radius almost equal to that of the wiring harness.

8. A high frequency current inducing apparatus accordingly to claim 6, wherein said outer conductor has a curved surface semicircularly curved along the radius of an inserted wiring harness.

9. A high frequency current inducing apparatus according to claim 8, wherein said curved surface of said outer conductor is curved with a radius almost equal to that of the wiring harness.

10. A high frequency current inducing apparatus according to claim 1, wherein said inserting holes are circular, and may be opened to semicircular portions when said outer conductor portions are separated.

11. A high frequency current inducing apparatus according to claim 1, wherein said outer conductor includes a holding lock for holding said two outer conductor portions together.

12. A high frequency current inducing apparatus according to claim 1, wherein both of said outer conductors and said inner conductor comprise relatively low-specific resistance material.

13. A high frequency current inducing apparatus according to claim 1, wherein said high frequency inducing chamber means has constant impedance characteristics along its axial length.

14. A high frequency current inducing apparatus according to claim 1, wherein an input impedance of said high frequency current inducing chamber means is equal to an output impedance of said high frequency oscillator, and an input impedance of said terminator is equal to the output impedance of said high frequency oscillator and the output impedance of said high frequency current inducing chamber means.

15. A high frequency current inducing apparatus according to claim 14, further including cables electrically inter-connecting said high frequency current inducing chamber means to the high frequency oscillator and said high frequency current inducing chamber means to said terminator, which cables match the impedance characteristics of said high frequency current inducing chamber means.

* * * * *